(12) United States Patent
Hoag et al.

(10) Patent No.: US 7,049,181 B2
(45) Date of Patent: May 23, 2006

(54) METHOD OF MAKING HETEROJUNCTION P-I-N DIODE

(75) Inventors: David Russell Hoag, Walpole, MA (US); Timothy Edward Boles, Tyngsboro, MA (US); James Joseph Brogle, Woburn, MA (US)

(73) Assignee: M/A-Com, Lowell, MA (US)

( * ) Notice: Subject to any disclaimer, the term of this patent is extended or adjusted under 35 U.S.C. 154(b) by 0 days.

(21) Appl. No.: 10/915,579

(22) Filed: Aug. 10, 2004

(65) Prior Publication Data

US 2005/0006729 A1    Jan. 13, 2005

Related U.S. Application Data

(62) Division of application No. 10/139,067, filed on May 3, 2002, now Pat. No. 6,794,734.

(51) Int. Cl.
    *H01L 21/332* (2006.01)
(52) U.S. Cl. .................... 438/133; 438/761
(58) Field of Classification Search ............ 438/133, 438/761; 257/656
    See application file for complete search history.

(56) References Cited

U.S. PATENT DOCUMENTS

| | | | |
|---|---|---|---|
| 4,600,935 A | 7/1986 | Dresner | 357/58 |
| 4,604,636 A | 8/1986 | Dalal | 357/2 |
| 4,847,215 A | 7/1989 | Hanaki et al. | 437/100 |
| 5,594,237 A | 1/1997 | Kulick et al. | 250/214.1 |
| 5,615,143 A | 3/1997 | MacDonald et al. | 365/112 |
| 5,644,156 A | 7/1997 | Suzuki et al. | 257/285 |
| 5,670,791 A | 9/1997 | Halls et al. | 257/40 |
| 5,677,551 A | 10/1997 | Imamura et al. | 257/95 |
| 5,680,073 A | 10/1997 | Nathan et al. | 327/586 |
| 5,889,296 A | 3/1999 | Imamura et al. | 257/184 |
| 5,914,504 A | 6/1999 | Augusto | 257/192 |
| 5,920,088 A | 7/1999 | Augusto | 257/192 |
| 5,923,049 A | 7/1999 | Böhm et al. | 257/55 |
| 5,963,800 A | 10/1999 | Augusto | 438/212 |
| 6,055,087 A | 4/2000 | Kwon et al. | 359/248 |

(Continued)

FOREIGN PATENT DOCUMENTS

EP    0 515 840 A2    12/1992

(Continued)

OTHER PUBLICATIONS

Applied Physics Letters, vol. 48, No. 21, pp. 1461-1463, by Miura et al., May 1986.*

(Continued)

*Primary Examiner*—Mark V. Prenty (57) ABSTRACT

A heterojunction P-I-N diode switch comprises a first layer of doped semiconductor material of a first doping type, a second layer of doped semiconductor material of a second doping type and a substrate on which is disposed the first and second layers. An intrinsic layer of semiconductor material is disposed between the first layer and second layer. The semiconductor material composition of at least one of the first layer and second layer is sufficiently different from that of the intrinsic layer so as to form a heterojunction therebetween, creating an energy barrier in which injected carriers from the junction are confined by the barrier, effectively reducing the series resistance within the I region of the P-I-N diode and the insertion loss relative to that of homojunction P-I-N diodes.

7 Claims, 8 Drawing Sheets

U.S. PATENT DOCUMENTS

| | | | |
|---|---|---|---|
| 6,060,704 A * | 5/2000 | Hyun et al. | 250/214.1 |
| 6,207,977 B1 | 3/2001 | Augusto | 257/192 |
| 6,222,951 B1 | 4/2001 | Huang | 257/192 |
| 6,229,189 B1 | 5/2001 | Yap et al. | 257/414 |
| 6,552,371 B1 | 4/2003 | Levine et al. | 257/110 |
| 6,794,734 B1 * | 9/2004 | Hoag et al. | 257/656 |

FOREIGN PATENT DOCUMENTS

EP   0 567 256 A2   10/1993

OTHER PUBLICATIONS

American Heritage Dictionary, Second College Edition (1982), p. 867, plain meaning definition of "on".*

Chin C. K. et al; "Avalanche Multiplication in Al/sub/x/Ga/sub 1- x/As/GaAs Multiplayer Structures" Nov. 30-Dec. 1999, vol. 3896, pp. 385-394 XP008020896 Proceedings of the SPIE—The International Society for Optical Engineering, 1999, SPIE-Int. Soc. Opt. Eng. USA ISSN: 0277-786X, p. 386; Table 1.

Patent Abstract of Japan, Publication No. 2000269542, Publication Date: Sep. 29, 2000, Application Date Mar. 15, 1999 Application No. 11068076.

Patent Abstract of Japan, Publication No.: 2001298210, Publication Date: Oct. 26, 2001, Application Date Apr. 11, 2000, Application No. 2000109950.

* cited by examiner

METHOD OF MAKING HETEROJUNCTION P-I-N DIODE

CROSS REFERENCE TO RELATED APPLICATIONS

This application is a divisional application of U.S. patent application Ser. No. 10/139,067, filed May 3, 2002, now U.S. Pat. No. 6,794,734.

FIELD OF THE INVENTION

This invention relates generally to semiconductor devices, and more particularly to heterojunction semiconductor devices.

BACKGROUND OF THE INVENTION

P-I-N diodes are often used as switching elements in a variety of military and commercial applications. Such applications include automotive collision avoidance systems (CAS), passive radiation imaging systems and radar applications, and switch matrix devices useful for networking (e.g. internet) applications. Presently, P-I-N diodes used in such RF and microwave applications are fabricated as homojunction devices, such as silicon (Si) or gallium arsenide (GaAs) P-I-N diodes. These devices may be used as either discrete or as integrated components for switching functions useful at high frequency operation. Such high frequency operation may range from about one megahertz (MHz) to well above one hundred gigahertz (GHz).

Performance characteristics of present P-I-N switching diodes are often limited by parameters such as insertion loss and isolation. Insertion loss may be characterized as the ratio of the signal power output from the diode relative to the input signal power when the series-measured diode is in the "on" state. Isolation may be characterized as the ratio of the signal power output from the diode relative to the input signal power when the series-measured diode is in the "off" state. (Note that the reverse is true when the diode is measured in the shunt configuration.) A significant problem for P-I-N diode designers is how to reduce insertion loss without compromising isolation. For example, switches such as monolithic integrated single-pole single-throw (SPST), single-pole double-throw (SPDT) switches, and single pole multi-throw (SPMT) switches employing shunt connected P-I-N diodes require reduced reverse bias capacitance, but without undesirably increasing the series resistance within the intrinsic region (I-region) of the diode. Series diode configurations require reduced series resistance but without an undesirable increase in diode capacitance.

It is known that other heterojunction semiconductor devices exist such as bipolar junction transistors (BJTs), HEMTs, and other FET devices. However, such devices are typically N-P-N three terminal devices having base, emitter and collector terminals and are fabricated with a base that is thin enough to enable carriers to diffuse across that region in a relatively short time so that the device can operate at a high frequency. Further, heterojunction transistor devices are used in order to increase gain or amplification. For diode switch design, however, gain is not a consideration. There is a need to decrease the resistance of the diode by increasing the carrier concentration in the intrinsic region. An improved device and process for reducing insertion and return loss while preserving device isolation within a P-I-N diode is highly desired.

SUMMARY OF THE INVENTION

According to an aspect of the invention, a heterojunction P-I-N diode comprises a first layer of doped semiconductor material of a first doping type; a second layer of doped semiconductor material of a second doping type and a substrate on which is disposed the first and second layers. An intrinsic layer of semiconductor material is disposed between the first layer and second layer. The semiconductor material composition of at least one of the first layer and second layer is sufficiently different from that of the intrinsic layer so as to form a heterojunction therebetween. An energy barrier is created in which injected carriers from the junction are confined by the barrier, effectively reducing the series resistance within the I region of the P-I-N diode and the insertion loss relative to that of homojunction P-I-N diodes.

According to another aspect, the invention is embodied in a process of forming a heterojunction P-I-N diode switch comprising forming a semi-insulating substrate; forming a cathode layer by forming on the substrate a first layer of doped semiconductor material of a first doping type; forming an intrinsic layer of semiconductor material on the first layer; and forming an anode layer by forming a second layer of doped semiconductor material of a second doping type on the intrinsic layer, wherein at least one of the first layer and second layer is formed of semiconductor material different from that of the intrinsic layer to create a heterojunction therebetween, thereby providing an energy barrier. In this aspect, the anode and cathode may be reversed.

DETAILED DESCRIPTION

Figure 1A:
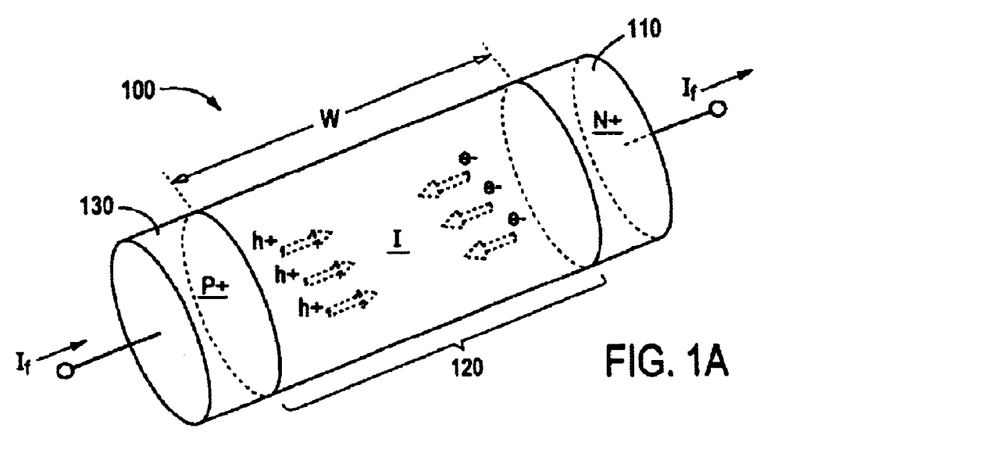
FIGS. 1A and 1B are exemplary illustrations of P-I-N diode operation at low frequency and high frequency device ranges.
Figure 1B:
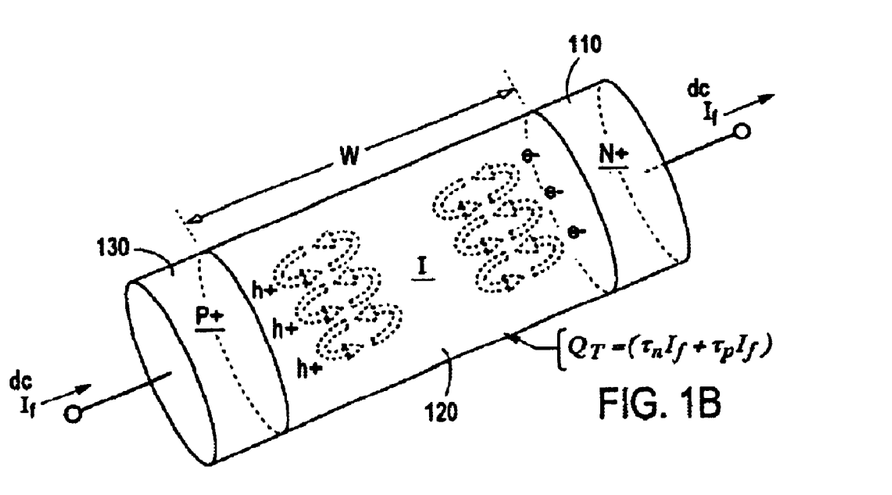

Referring now to FIGS. 1A and 1B, the basic theory of operation of P-I-N diodes will be briefly described. Throughout the drawings, like reference numerals are used to indicate like parts. P-I-N diode 100 comprises an intrinsic layer 120 of semiconductor material coupled between a layer 130 of P+ doped semiconductor material and a layer 110 of N+ semiconductor material. FIG. 1A illustrates schematically the diffusion of electrons (e) and holes (h) across the intrinsic (I) layer of width w upon application of a current source $I_f$ to the two terminal device at low frequency operation (DC to $f_t$). In this mode of operation, the current flow through the device may be described by the well-known diode equation $I=I_0(e^{q(V_a-IR_s)/nkT}-1)$. Operation of the P-I-N diode in this region may be characterized by a rectified RF voltage signal and a high loss non-linear device.

FIG. 1B illustrates schematically the high frequency operation ($f_0 > f_t$) of a diode device where the transition frequency $f_t$ is given by $f_t = \mu_p kT/qW^2$. As shown therein, the electrons and holes are generally unable to traverse the intrinsic layer width w within half $1/f_t$ of the RF signal frequency. The DC forward current $I_f$ contains the charge $Q_t$ within the I region where $Q_t$ may be characterized by $Q_t = (\tau_n I_f + \tau_p I_f)$ and where the resistance in the intrinsic layer $R_I$ is given by $R_I = W^2/2\mu_{ap} I_f \tau$. In accordance with an aspect of the present invention, an improved P-I-N diode is operative for decreasing the series resistance of the intrinsic layer ($R_I$) by increasing $Q_t$ without a corresponding increase in forward current $I_f$.

Figure 2:
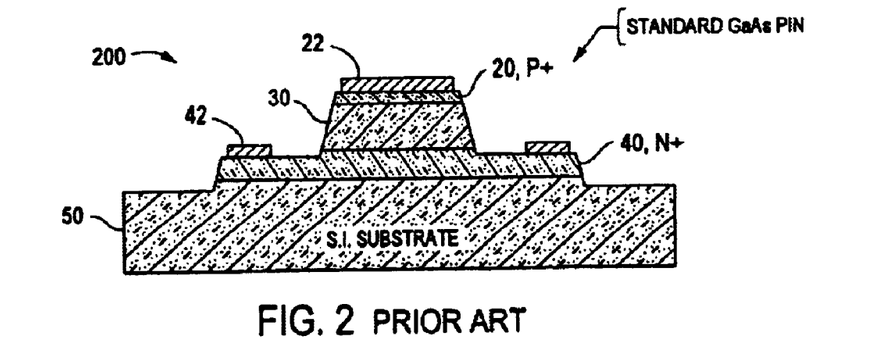
FIG. 2 is an illustration of a prior art P-I-N homojunction diode.

Referring now to FIG. 2, there is shown a cross-sectional view of a prior art homojunction gallium arsenide (GaAs) P-I-N diode 200 which suffers from insertion loss due to the high resistivity associated with the two terminal device. The device comprises a GaAs semi-insulating substrate layer 50 on which is disposed an N+ GaAs cathode layer 40. An intrinsic (I) layer 30 of GaAs is formed on a top surface of the N+ GaAs cathode layer 40 and a GaAs P+ layer 20 is formed on the top surface of the I-layer. A P-type ohmic metal contact 22 is disposed on GaAs P+ layer 20 and an N-ohmic metal contact 42 is disposed on the N+ GaAs cathode layer 40 to form the anode and cathode contacts.

Figure 3A:
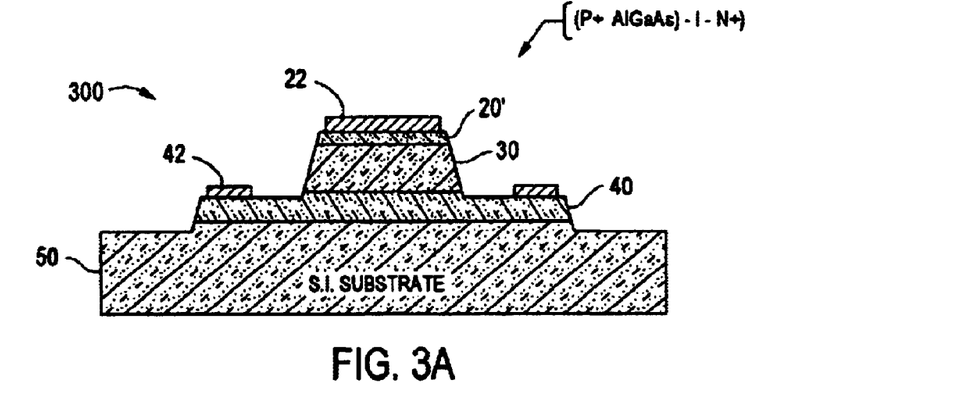
FIG. 3A is an illustration of a P-I-N diode heterojunction structure according to a first embodiment of the present invention.

Referring now to FIG. 3A, there is shown an embodiment of the present invention comprising a heterojunction P-I-N diode 300 which overcomes the aforementioned difficulties to provide a device having improved electrical characteristics. Diode 300 is a two terminal non-optical device suitable for use as a switch. As shown, the heterojunction P-I-N diode 300 comprises a semi-insulating substrate layer 50 formed of GaAs semiconductor material on which is epitaxially deposited a cathode layer 40 of N+ GaAs semiconductor material. N-type ohmic metal contacts 42 are disposed on a top surface of cathode layer 40 for providing an ohmic contact for the device. In a particular embodiment, the N+ layer comprises GaAs semiconductor material having a thickness of about 2 microns (μm) that is heavily doped with silicon (Si) at approximately $5 \times 10^{18}$ cm$^3$ to form the cathode contact. An intrinsic layer 30 of approximately 2 μm thick unintentionally doped GaAs is then epitaxially deposited on the top surface of layer 40 for establishing the breakdown voltage and the capacitance of the two terminal diode device. A layer 20' of P+ aluminum gallium arsenide (AlGaAs) having a thickness of about 0.8 μm is then epitaxially deposited on a top surface of the intrinsic layer 30. The AlGaAs P+ layer may be heavily doped with an impurity such as carbon at $5 \times 10^{19}$ cm$^{-3}$ and have an Al composition ranging from about 5% to 20% (i.e., about 5% to 20% of the total number of aluminum plus gallium atoms). A p-ohmic metal contact layer 22 is disposed on layer 20' to form the anode contact of the diode device.

For the device illustrated in FIG. 3A, the substrate thickness may range from approximately 4 mils to 8 mils. For shunt diode fabrication, via holes are etched under the diode and contacted with the N+ region on the backside of the device. For series diode fabrication, the substrate is typically 8 mils, while for shunt diodes which require etched via holes, the substrate is etched down to 4 mils and vias are provided within the substrate.

In the heterojunction device shown in FIG. 3A, the AlGaAs semiconductor material 20' has a wider band gap in the P+ anode region, as compared to that of the I region. This difference in band gap (the difference in energy between the conduction and valence bands in a semiconductor material) enables a suitable barrier height difference to be created, which both enhances forward injection of holes from the P+ anode into the I region and retards the back injection of electrons from the I region into the P+ anode. In the single heterojunction P-I-N device of FIG. 3A, the injected carriers of the junction are confined due to the band gap difference, effectively reducing the series resistance within the I region of the diode. Thus, in the P-I-N heterojunction diode, there is an increased carrier concentration in the I region. This in turn reduces the resistance in the I region which enables reduction of insertion loss (e.g. at microwave $f_0 > f_t$ frequencies) with no compromise in isolation. Accordingly, the use of a heterojunction structure within a P-I-N diode switch wherein two dissimilar semiconductor material layers 20', 30 have different band gaps (wherein layer 20' has a width greater than that of layer 30) results in a P-I-N diode structure having a significantly higher concentration of charge carriers and reducing the RF resistance in the I region of the heterojunction P-I-N diode device.

It is understood that the heterojunction P-I-N diode of the present invention is operable as a high frequency switch by operating effectively as a high frequency resistor. That is, one can change the value of the I region resistance by many orders of magnitude as a function of the application of a DC bias to the device. More particularly, when the diode is in the "off" state, the diode operates as an electrical open, such that coupling occurs only through capacitance. Accordingly, by making the capacitance small, coupling is minimal at high frequencies. Thus, the smaller the capacitance, the greater the high frequency impedance of the device. This represents the operation of the device in the isolation mode. However, when the device is turned on, current must be conducted through the device, thus necessitating the need for reduced series resistance.

Figure 3B:
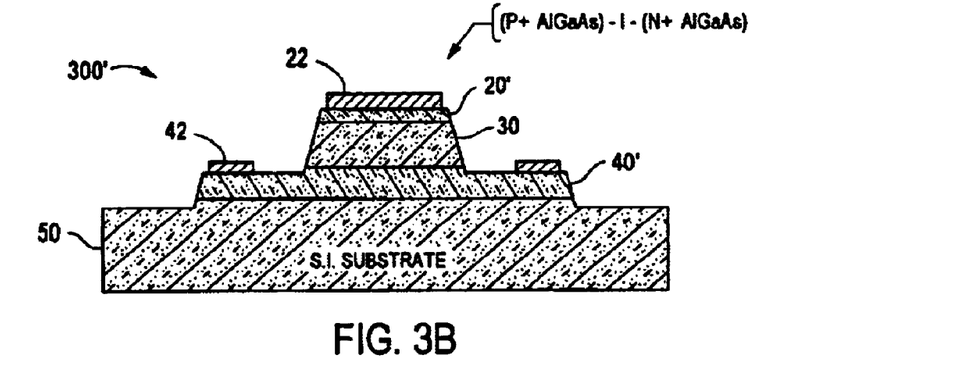
FIG. 3B is an illustration of a P-I-N diode heterojunction structure according to a second embodiment of the present invention.

FIG. 3B shows a double heterojunction P-I-N diode structure 300' according to a second embodiment of the invention. As shown therein, cathode layer 40 of FIG. 3A is replaced by a layer 40' of N+ semiconductor material with composition of AlGaAs so as to form a heterojunction at the interface with intrinsic layer 30. In this manner, a double heterojunction P-I-N diode device is formed. That is, I-layer 40 is coupled at a first heterojunction interface to P+ AlGaAs layer 20' and at a second heterojunction interface to N+ AlGaAs layer 40'. Semiconductor material thicknesses and concentrations remain substantially as indicated with respect to the structure shown in FIG. 3A. That is, in the exemplary embodiment shown in FIG. 3B, AlGaAs P+ layer 20' is about 0.8 microns in thickness and 5% Al concentration while N+ cathode layer 40' has a thickness of about 2 microns and 5% Al concentration. Intrinsic layer 30 has a thickness of about 2 microns.

Figure 3C:
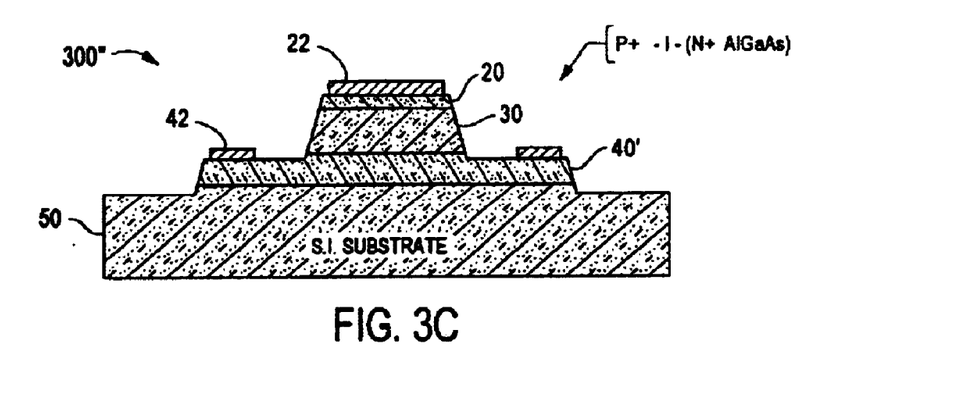
FIG. 3C is an illustration of a P-I-N diode heterojunction structure according to a third embodiment of the present invention.

FIG. 3C represents yet another embodiment of a single heterojunction diode P-I-N 300" wherein cathode layer 40' comprises an N+ AlGaAs layer disposed on substrate 50. Intrinsic layer 30 is epitaxially deposited on a top surface of cathode layer 40'. GaAs P+ layer 20 of about 0.8 microns in thickness is epitaxially deposited on a top surface of I-layer 30. In this embodiment, the heterojunction interface occurs at the N+ AlGaAs layer 40' interface with the GaAs I-layer 30. Intrinsic layer 30 and N+ cathode layer 40' each have a thickness of about microns, with layer 40' having a 5% Al concentration.

Figure 8:
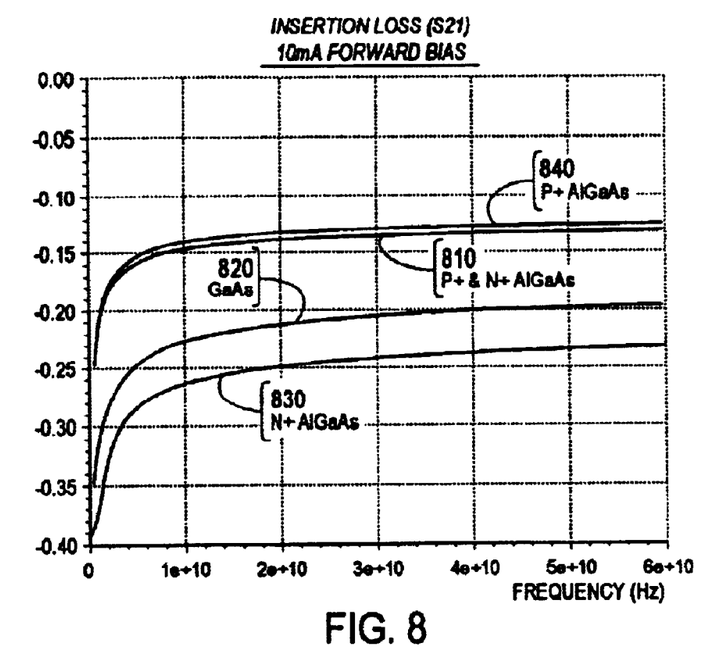
FIG. 8 is an exemplary illustration of a frequency response plot of insertion loss for heterojunction P-I-N diode structures in accordance with an aspect of the present invention.
Figure 9:
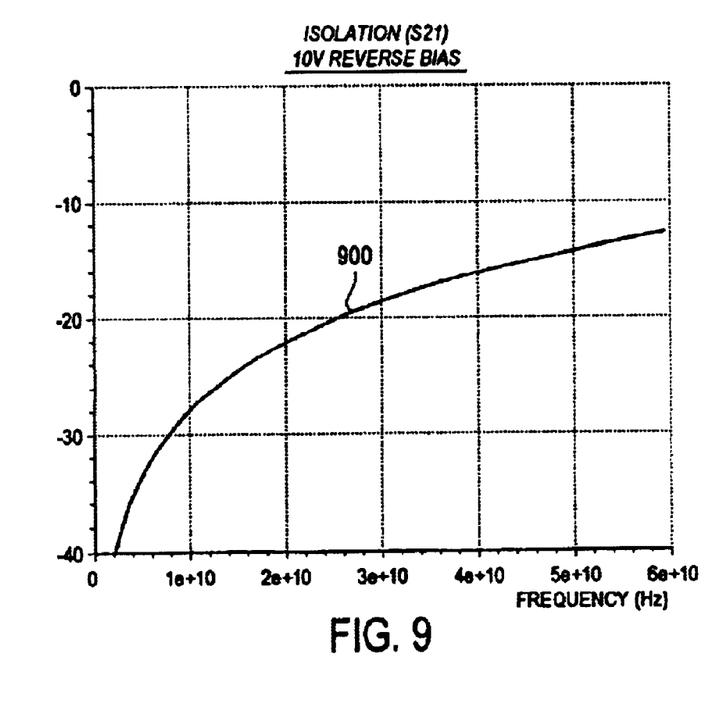
FIG. 9 is an exemplary illustration of a frequency response plot of reverse biased isolation for heterojunction P-I-N diode structures in accordance with an aspect of the present invention.
Figure 10:
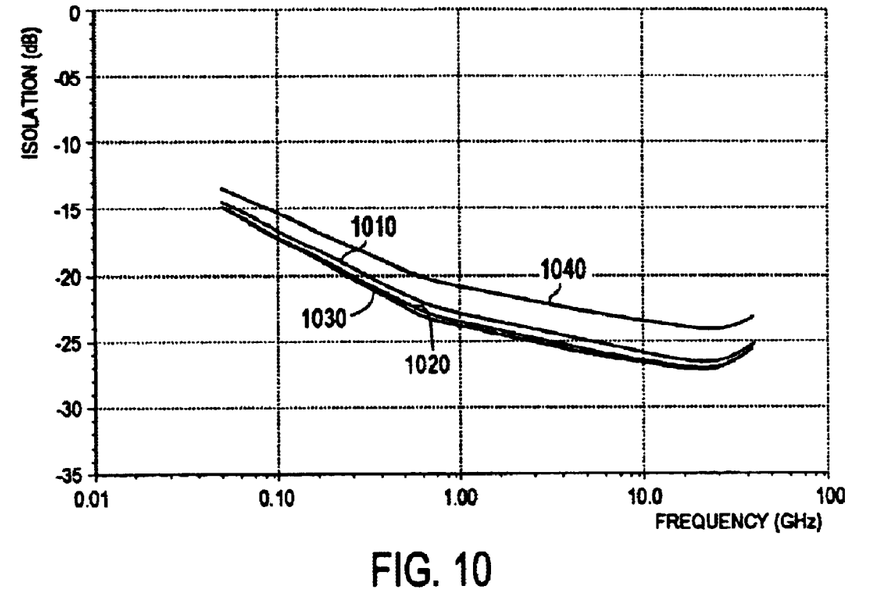
FIG. 10 is an exemplary illustration of measured isolation for a heterojunction P-I-N shunt diode configuration of varying composition in accordance with an aspect of the present invention.

FIGS. 4–10 represent simulations utilizing modeling software for modeling the performance and device characteristics of the single and double heterojunction P-I-N structures shown in FIGS. 3A–3C. These Figures also indicate performance characteristics associated with conventional homojunction P-I-N diodes for comparison with the heterojunction device embodiments of the present invention. Note that FIGS. 4–9 represent series diode configurations while FIG. 10 represents a shunt diode configuration.

Figure 4:
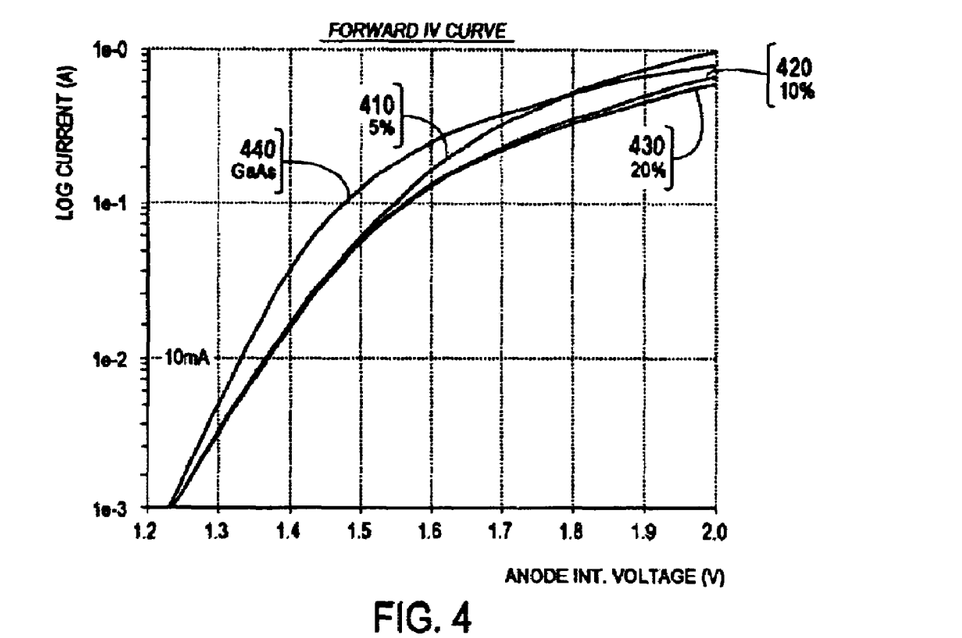
FIG. 4 is a graphic simulation of the forward current vs. voltage characteristics for different heterojunction P-I-N diode structures and compositions in accordance with an aspect of the present invention.
Figure 5:
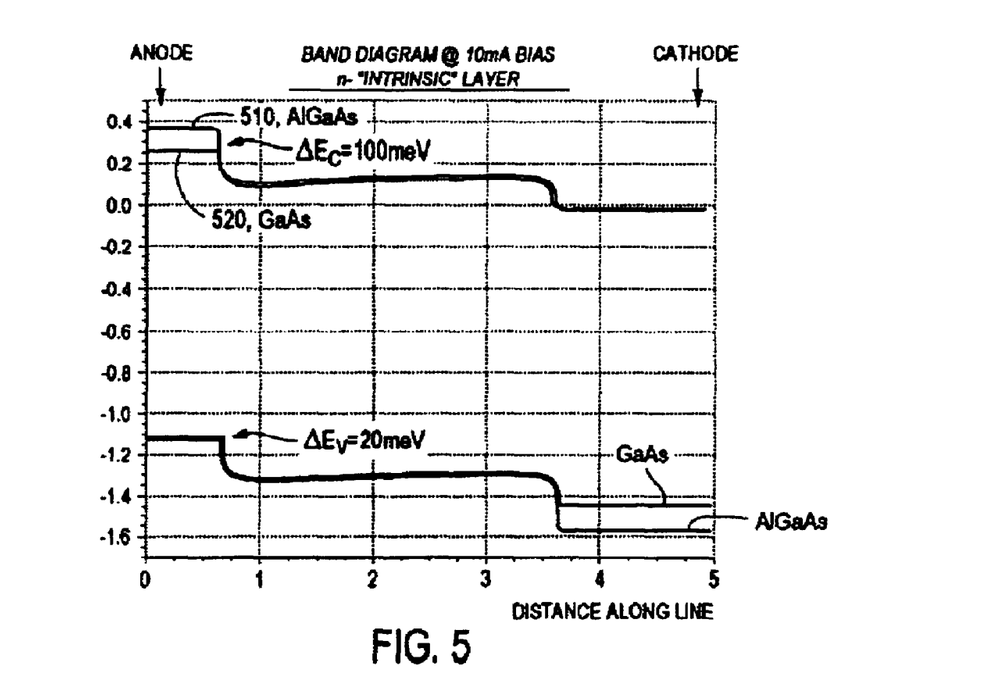
FIG. 5 is an exemplary illustration of an energy band diagram showing resultant barrier heights for a P+ AlGaAs heterojunction P-I-N diode structure in accordance with an aspect of the present invention.

FIG. 4 is an exemplary illustration of the effect of employing different energy band gaps at the P+-I junction by varying the aluminum (Al) concentration contained in the P+ layer 20' (FIGS. 3A, 3B). The simulated forward current vs. voltage (IV) characteristics for three different P+ AlGaAs heterojunction diode structures using 5%, 10% and 20% Al compositions and biased at 10 mA are illustrated via curves 410, 420 and 430 respectively. Curve 440 represents the forward IV characteristic for the GaAs homojunction (prior art) case. The results shown in FIG. 4 indicate virtually no difference in the slope of forward voltage (DC resistance) above 5% AlGaAs concentration when compared at a forward bias current of 10 milliamps (mA). FIG. 5 illustrates a barrier height change $\Delta E_C$ in conduction band energy of about 100 meV and valence band energy $\Delta E_v$ of about 20 meV resulting from differences in the energy between the larger band gap 510 of the AlGaAs layer and the lower band gap 520 of the GaAs semiconductor material. The band diagram shown in FIG. 5 represents the energy band for a P-I-N diode structure embodied in the present invention at a bias current of 10 mA. The resulting barrier height difference at the P+ heterojunction interface reduces the recombination rate for electrons and promotes the forward injection of holes to the I region.

Figure 6:
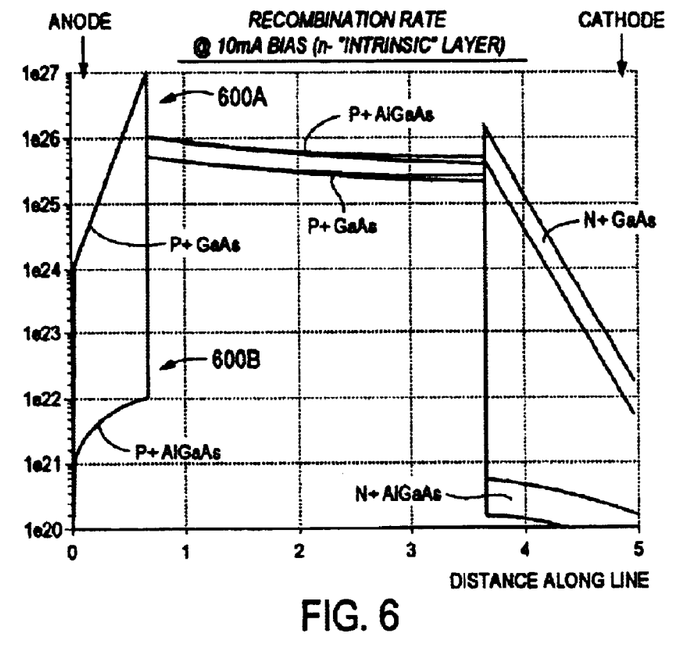
FIG. 6 is an exemplary illustration of electron and hole recombination rates simulated from heterojunction P-I-N diode structures in accordance with an aspect of the present invention.

FIG. 6 provides a schematic illustration of the recombination rate for electrons at the various P, I, and N regions for both the P-I-N heterojunction device structures shown in FIG. 3, as well as the conventional homojunction device. As shown in FIG. 6, the recombination rate for electrons at the P+ GaAs-I region junction 600A is sizable in comparison to the P+AlGaAs heterojunction 600B. The lower recombination rate in the P+ layer is due to the potential barrier preventing electron injection into the P+ layer. The higher recombination rate in the I region is due to the additional carriers. The combination of lower recombination rates and higher carrier injection yields higher number of carriers in the I region, thus lowering the effective resistivity of this layer.

Figure 7:
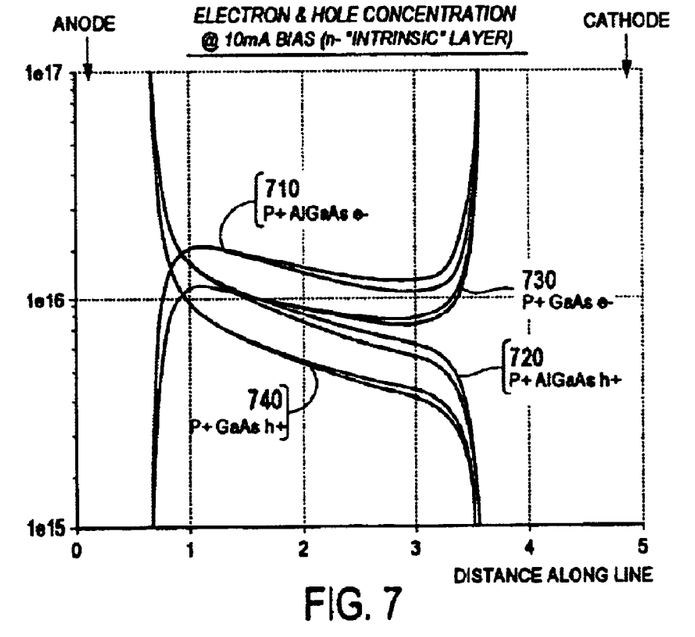
FIG. 7 is an exemplary illustration of electron and hole concentration distributed within heterojunction P-I-N diode structures in accordance with an aspect of the present invention.

FIG. 7 provides a graphical illustration of the simulation results of the electron and hole carrier concentrations distributed within the heterojunction structures depicted in FIG. 3 for comparison with the prior art homojunction P-I-N diode structure. Curve 710 represents the electron concentration (cm$^{-3}$) for the P+ AlGaAs layer as a function of distance. Curve 720 illustrates the hole concentration at bias of 10 mA for the AlGaAs semiconductor material, while figures 730 and 740 represent the electron and hole concentrations, respectively, for GaAs at 10 mA bias. Intrinsic region resistance may be characterized as $R_I = W^2/qA(u_p h^+ + u_n e^-)$ where $u_n$ and $u_p$ represent the electron mobility and hole mobility respectively. For the heterojunction P-I-N diode structure in accordance with an aspect of the present invention, the electron and hole concentrations (e$^-$+h$^+$) are about 2.2E16, while for the homojunction GaAs structure, the electron and hole concentrations are approximately 1.4E16. This represents an increase of approximately 57% in the charge within the I region.

FIG. 8 illustrates projected insertion losses as a function of frequency for a given forward bias of 10 mA. As shown in FIG. 8, curve 810 shows the insertion loss for the double heterojunction P-I-N diode structure (FIG. 3B) formed at the P+I-region and I-region/N+ interface and illustrates a significantly lower RF resistance in comparison to the insertion loss curve 820 for the homojunction GaAs P-I-N structure. Note however that this simulation also indicates the insertion loss curve 830 for the P+-I-N+ AlGaAs single heterojunction P-I-N diode shown in FIG. 3C has a higher insertion loss. The single heterojunction P+ AlGaAs-I-N P-I-N diode structure provides the best performance with the lowest overall insertion loss curve 840.

FIG. 9 shows frequency response plots of reverse bias isolation for each of the P-I-N diode structures of FIGS. 2 and 3. These curves (900) demonstrate virtually no change in reverse bias isolation due to the insensitivity of the reverse bias capacitance for each of the P-I-N diode structures. This enables the reduction in loss without penalty in isolation.

Figure 12A:
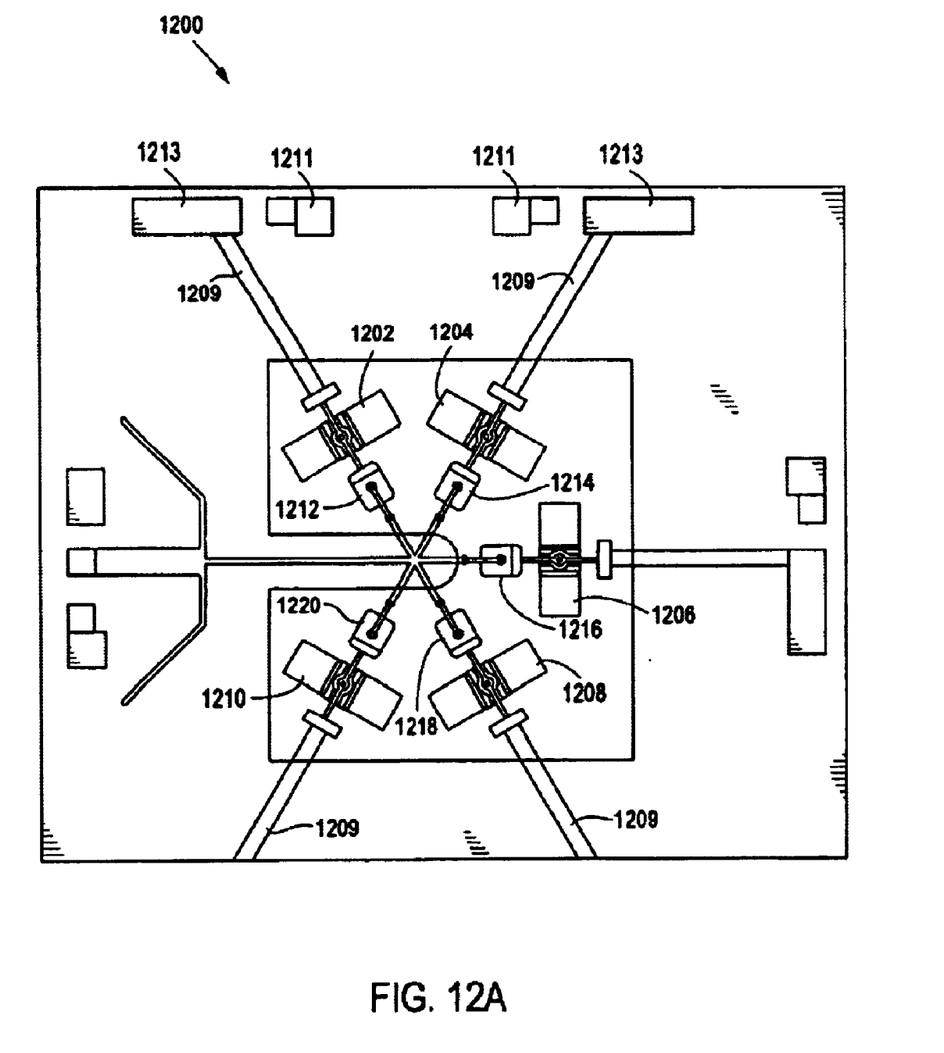
FIG. 12A is an exemplary illustration of a switching device comprising a plurality of interconnected heterojunction P-I-N diode structures in accordance with an aspect of the present invention.
Figure 12B:
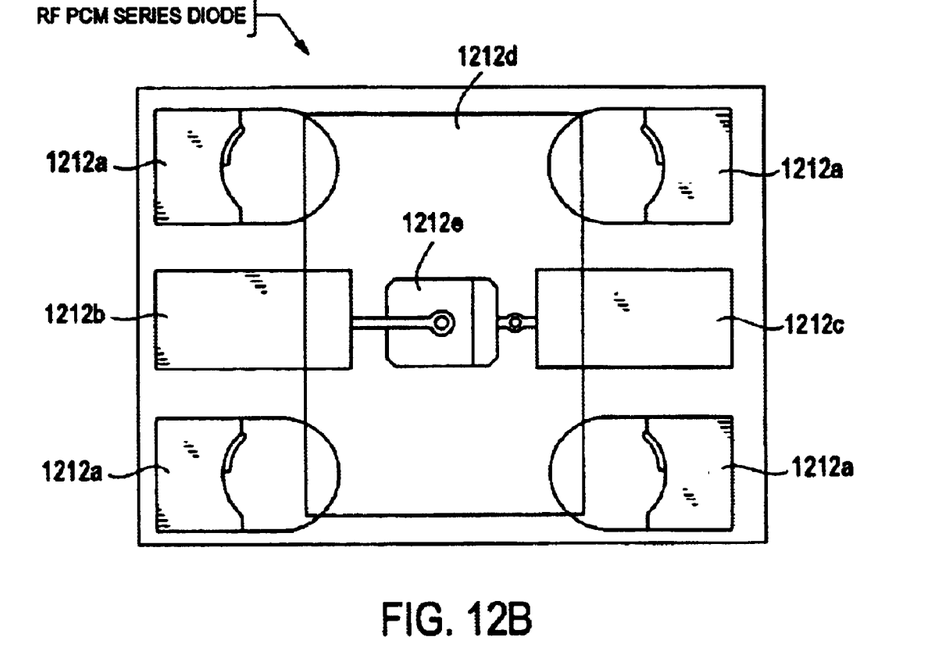
FIG. 12B is an exemplary illustration of a heterojunction P-I-N series diode structure in accordance with an aspect of the present invention.
Figure 12C:
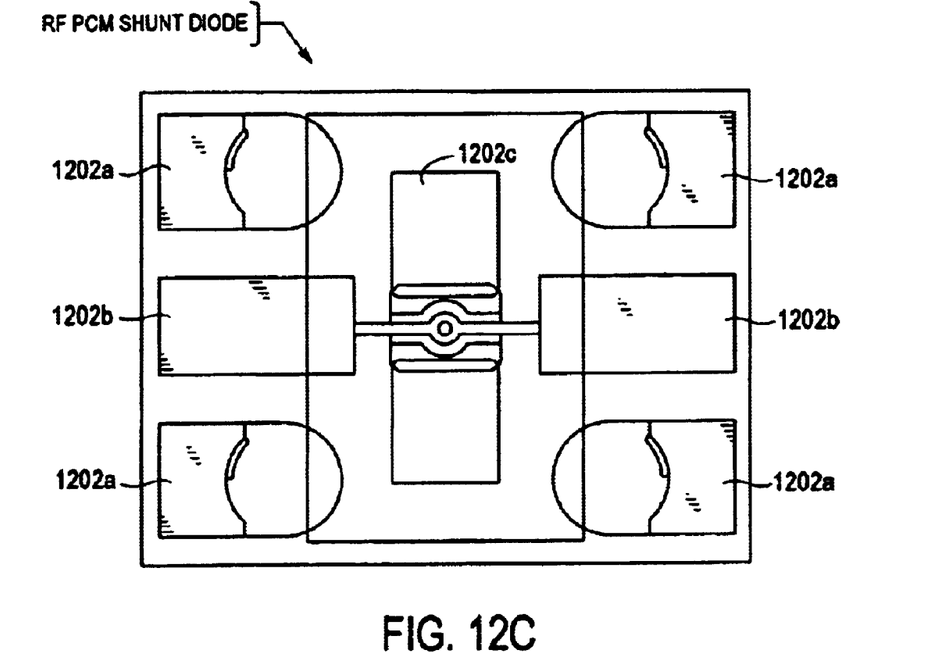
FIG. 12C is an exemplary illustration of a heterojunction P-I-N shunt diode structure in accordance with an aspect of the present invention.

FIG. 12A provides an exemplary illustration of a switching device 1200 comprising a plurality of interconnected heterojunction P-I-N diode structures including shunt diodes 1202, 1204, 1206, 1208, 1210, and series diodes 1212, 1214, 1216, 1218, and 1220 in accordance with an aspect of a present invention. As shown, switch 1200 may comprise multiple throw switches interconnected in both shunt diode and series diode configurations to perform specific functions as required for a particular application. Transmission lines 1209 connect the diode anodes with bond pads 1213. Ground contacts 1211 provide ground connectivity through the backside of the structure. FIG. 12B provides an exemplary illustration of a heterojunction P-I-N diode formed in a series diode configuration and including ground electrodes 1212a, anode 1212b and cathode 1212c, encapsulation area 1212d and metallized cathode contact 1212e. FIG. 12C provides an exemplary illustration of a shunt diode structure including ground electrodes 1202a, anode contacts 1202b and cathode contact 1202c made through the backside and shunted to ground.

FIG. 10 provides an exemplary illustration of measured isolation for a heterojunction P-I-N shunt diode configuration of varying Al composition relative to that of conventional homojunction devices. Curve 1010 depicts the isolation (in dB) as a function of frequency (GHz) for a 5% AlGaAs heterojunction P-I-N structure in the "on state" at a bias of 10 mA. Curve 1020 depicts a heterojunction diode structure comprising 10% AlGaAs, while 1030 represents a 20% AlGaAs heterojunction P-I-N structure. Finally, curve 1040 illustrates the conventional GaAs P-I-N shunt diode structure in the on state at a bias of 10 mA. As shown, the heterojunction P-I-N diode curves 1010, 1020 and 1030 indicate an approximately 3 dB difference in isolation at a frequency of 10 GHz.

In accordance with a further aspect, a process for fabricating P-I-N heterojunction devices utilizes a low pressure metal organic vapor phase epitaxial (LP-MOVPE) reactor and designed reaction chambers. In a preferred embodiment, a semi-insulating substrate of GaAs semiconductor material is formed. Both GaAs and AlGaAs films may be grown at about 76 Torr at a rate of about 0.08 microns per minute within $AsH_3$/(TMGa+TMAl) flow ratio of 25:1. Hydrogen flow rates of 6 liters per minute produce flow velocities in excess of 30 cm/sec were optimized in the reaction chamber to achieve minimal growth variation and abrupt doping and compositional transitions between layers. Uniformities across a 3-inch diameter wafer substrate for doping typically averaged +/−2%, while thickness uniformities averaged +/−3%. Photoluminescence measurements of the aluminum composition across the AlGaAs films indicate uniformities of +/−2%.

The heterojunction P+-I-N regions in the P-I-N structure are formed by growing the AlGaAs layer at the same substrate temperature as the GaAs intrinsic and N+ layers. In a preferred embodiment, a carbon-doped P layer of the P-I-N structure produces a film yielding a high concentration of holes with minimal hydrogen and oxygen incorporation. It is understood that the introduction of oxygen bearing species into the growth environment through various means such as minor gas leaks, contaminated precursors or temporary exposure of the reaction chamber to air during wafer loading can pose a serious challenge to growing device quality AlGaAs films. The chemical affinity of aluminum to oxygen forms a strong bond that enhances the incorporation of oxygen into the crystal structure. Such contaminates may create deep electron trap levels that form non-radiative recombination centers. This would reduce the AlGaAs film of its photoluminescence efficiency while increasing the electrical compensation. Furthermore, high temperature growth (greater than 700 degrees C.) of AlGaAs would enhance the optical properties of the film while reducing the hydrogen passivation of the carbon. However, low temperature growth below 600 tends to favor carbon incorporation, thereby significantly increasing the conductivity of the film and reducing the contact resistance of the ohmic metallization. In accordance with an aspect of the present invention, both the AlGaAs P+ layer and the GaAs intrinsic (I) and N+ layers were grown at the same substrate temperature of about 650 degrees, providing a significant increase in the electrical properties and carrier concentrations of the heterojunction P-I-N structure. The carrier concentration and mobility of the GaAs N+ and the AlGaAs P+ layers were evaluated using Van der Pauw-Hall measurement techniques. The net ionized impurity concentrations estimated from differential C—V measurements were evaluated on large area mesa samples of completed heterojunction P-I-N diode structures.

In accordance with an aspect of the present invention, the process of forming the heterojunction P-I-N diode structure begins with depositing a 2 μm N+ layer of semiconductor material heavily doped with silicon at 5E18 ($cm^{-3}$) deposited on a semi-insulating substrate layer. This bottom layer serves as a cathode contact. A next layer of a 2 μm unintentionally doped (intrinsic layer) of semiconductor material is used to establish the breakdown voltage and capacitance of the device. This intrinsic layer is epitaxially deposited onto the first N+ layer. The final layer in the epitaxial stack is a 0.7 μm–0.8 μm thick P+ AlGaAs layer heavily doped with carbon at 5E19 ($cm^{-3}$). This top layer of the heterojunction structure serves as the anode contact of the device.

Figure 11:
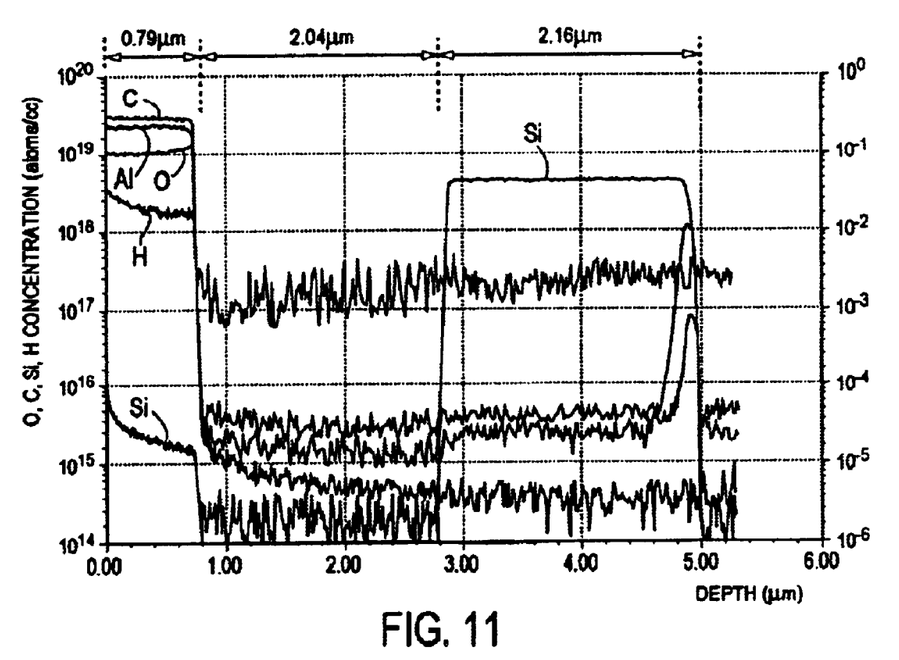
FIG. 11 is a Secondary Ion Mass Spectrometry (SIMS) profile of a heterojunction P-I-N diode structure containing 20% aluminum in accordance with an aspect of the present invention.

A Secondary Ion Mass Spectrometry (SIMS) profile of a P+$Al_{0.2}Ga_{0.8}As$ heterojunction P-I-N diode structure formed in accordance with this process is illustrated in FIG. 11. As shown in FIG. 11, the presence of oxygen contamination distributed throughout the GaAs layers is within the detection limit of the SIMS characterization equipment. However, the amount of oxygen detected in the AlGaAs layer is approximately 1E19, which is approaching the same concentration as the carbon (C). This amount of oxygen is excessive and is of concern given that it may adversely impact the series resistance of the device. Advantageously however, the hydrogen content in the P+ anode layer is less than 7% of the carbon concentration. This amount of hydrogen is not anticipated to pose any reliability problems with this device. The transition width of the heterojunction and the doping distributions between each layer is well within 300 Å.

It is to be understood that the embodiments and variations shown and described herein are for illustrations only and that various modifications may be implemented by those skilled in the art without departing from the scope of the invention.

For example, while an AlGaAs semiconductor material device and process has been described for the formation of a heterojunction P-I-N diode, it is to be understood that a wide variety of III-V materials may be employed as bandgap modifiers including, for example Indium Gallium Phosphide (InGaP), Indium phosphide (InP), as well as other III-V materials. Furthermore, P-I-N diode structures may not be limited to III-V compounds, but may include group II-VI, or group IV—IV materials including silicon (Si), germanium (Ge), carbon (C), SiGe, SiC, or SiGeC materials, for example. In these cases, the band gap of the anode should be greater than the band gap of the I-region. Further, note that lowering the bandgap $E_g$ in the I-region relative to the P region achieves the same result, namely that of confining charge carriers by building a sufficiently large barrier between the P and I regions.

What is claimed is:
1. A method of forming a heterojunction P-I-N diode switch comprising:
  forming a semi-insulating substrate;
  forming on the substrate a first layer of doped semiconductor material of a first doping type to form a cathode layer;

forming an intrinsic layer of semiconductor material on the first layer; and forming a second layer of doped semiconductor material of a second doping type on the intrinsic layer to form an anode layer, wherein at least one of the first layer and second layer is formed of semiconductor material different from that of the intrinsic layer to create a heterojunction therebetween, thereby providing an energy barrier;

whereby a heterojunction P-I-N diode switch is formed.

2. The method of claim 1, wherein the first layer, second layer and intrinsic layer are formed at a same temperature.

3. The method of claim 2, wherein the same temperature is between 600 and 700 degrees celsius.

4. The method of claim 2, wherein the same temperature is approximately 650 degrees celsius.

5. The method of claim 1, wherein the step of forming the cathode layer comprises epitaxially growing on the substrate a first layer of n-type GaAs.

6. The method of claim 1, wherein the step of forming the anode layer comprises epitaxially growing on the intrinsic layer a second layer of p-type AlGaAs.

7. The method of claim 1, wherein at least one of the first layer and second layer of doped semiconductor materials has an energy bandgap greater than an energy bandgap of the intrinsic layer.

* * * * *